(12) United States Patent
Lee (10) Patent No.: US 7,968,799 B2
(45) Date of Patent: Jun. 28, 2011

(54) INTERPOSER, ELECTRICAL PACKAGE, AND CONTACT STRUCTURE AND FABRICATING METHOD THEREOF

(75) Inventor: Yuan-Chang Lee, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 1026 days.

(21) Appl. No.: 11/773,439

(22) Filed: Jul. 5, 2007

(65) Prior Publication Data
US 2008/0093115 A1    Apr. 24, 2008

(30) Foreign Application Priority Data
Oct. 20, 2006 (TW) ................................ 95138691 A (51) Int. Cl.
*H05K 1/03* (2006.01)
*H05K 1/11* (2006.01)
*H01K 3/10* (2006.01)
(52) U.S. Cl. .................... 174/255; 174/262; 29/852
(58) Field of Classification Search .......... 174/260–264, 174/265–266, 255; 361/760, 792–795; 29/846–853
See application file for complete search history.

(56) References Cited

U.S. PATENT DOCUMENTS

| 4,893,172 | A | | 1/1990 | Matsumoto et al. | |
|---|---|---|---|---|---|
| 5,550,325 | A | * | 8/1996 | Matsuda | 174/250 |
| 5,576,517 | A | * | 11/1996 | Wojnarowski et al. | 174/262 |
| 5,763,941 | A | | 6/1998 | Fjelstad | |
| 6,378,758 | B1 | | 4/2002 | Haba | |
| 6,492,200 | B1 | * | 12/2002 | Park et al. | 438/113 |
| 6,816,385 | B1 | * | 11/2004 | Alcoe | 361/767 |
| 6,836,022 | B2 | * | 12/2004 | Boone et al. | 257/778 |

OTHER PUBLICATIONS

"Office Action of Taiwanese counterpart application", issued on May 27, 2009, p. 1-p. 9.

* cited by examiner

*Primary Examiner* — Jeremy C Norris
(74) *Attorney, Agent, or Firm* — Jianq Chyun IP Office (57) ABSTRACT

A contact structure on a substrate which has at least one contact is provided. The contact structure includes a compliant layer, at least one solder pad, at least one conductive via, and at least one conductive arm. The compliant layer is disposed on the substrate and covers the contact. The solder pad is disposed on the surface of the compliant layer which is at the opposite side of the substrate. The conductive via is disposed in the compliant layer and is connected to the contact. The conductive arm is disposed on the surface of the compliant layer in opposite to the substrate, and two ends of the conductive arm are respectively connected to the conductive via and the solder pad. Furthermore, a method for fabricating the contact structure, an interposer and an electrical package using the contact structure are provided.

26 Claims, 9 Drawing Sheets

INTERPOSER, ELECTRICAL PACKAGE, AND CONTACT STRUCTURE AND FABRICATING METHOD THEREOF

CROSS-REFERENCE TO RELATED APPLICATION

This application claims the priority benefit of Taiwan application serial no. 95138691, filed Oct. 20, 2006. All disclosure of the Taiwan application is incorporated herein by reference.

BACKGROUND OF THE INVENTION

1. Field of the Invention

The present invention relates to the components of an electrical package and a fabricating method thereof. More particularly, the present invention relates to an electrical package of high reliability, an interposer thereof, a contact structure on a substrate, and a fabricating method of the contact structure.

2. Description of Related Art

The operation speed of chips has been improved continuously along with the development in the fabrication technique of integrated circuits (IC), thus, the process and calculation of various digital data has become very efficient. However, along with the drastic increase in the integration of chip's internal circuit, the heat produced by an electrical package carrying the chip has increased accordingly, thus, the problem of improper operation of package device due to thermal stress is always incurred, and meanwhile, the reliability of the package device is affected.

A conventional electrical package includes a first level package of a bonded chip and chip carrier, and a second level package of the chip carrier carrying the chip and a circuit board. Due to the difference in coefficient of thermal expansion (CTE) between the chip, the chip carrier, and the circuit board, different thermal strains may be produced because of different operation temperatures between components of the package during the packaging process or the reliability testing and actual operation thereafter. In recent years, a packaging technique for directly bonding a chip and a circuit board is developed to meet the requirement in the design of light, thin, short, and small electrical packages. The bonding between the chip and the circuit board is damaged even more easily by stress because the difference in CTEs of the chip and the circuit board is even larger, accordingly the reliability of the product is affected.

Presently, there are two means for improving the reliability of the contact between an electronic device and a circuit board. Firstly, improvement is done to the electronic device, for example, devices are packaged as a ball grid array (BGA) type and the difference of CTEs between the electronic device and the circuit board is minimized via an organic substrate, or a wafer level package with a compliant layer is proposed for the electronic device. On the other hand, a special structure can be designed on the circuit board for eliminating stress.

Figure 1A:
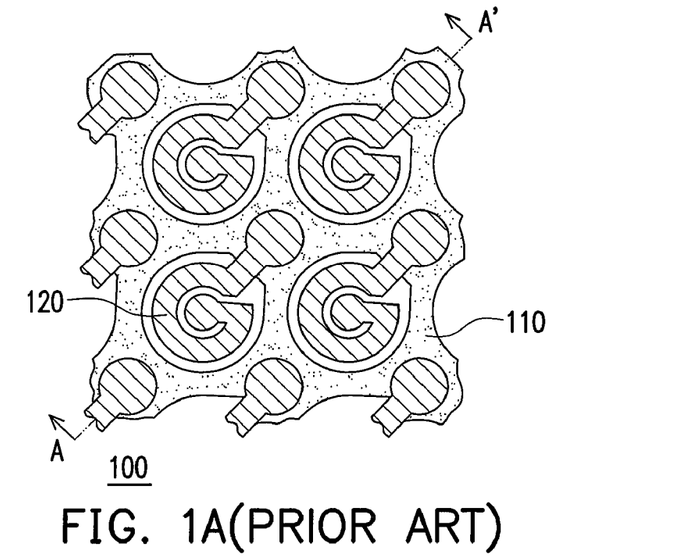
FIG. 1A is a plan view of a conventional contact structure.
Figure 1B:
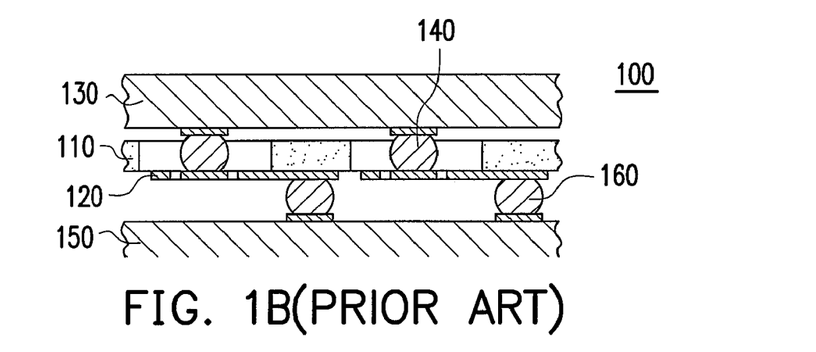
FIG. 1B is a cross-sectional view of the contact structure in FIG. 1A.
Figure 1C:
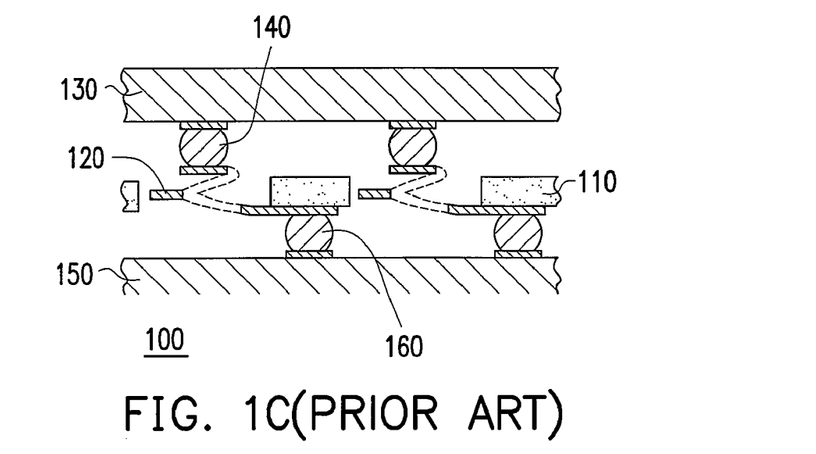
FIG. 1C is a cross-sectional view of the contact structure in FIG. 1B which is deformed.

A contact structure for eliminating stress is disclosed in U.S. Pat. No. 4,893,172. FIG. 1A shows the contact structure. FIG. 1B is a cross-sectional view of the contact structure. FIG. 1C is a cross-sectional view of the contact structure which is deformed by stress. Referring to FIGS. 1A~1C, the contact structure 100 includes a flat helical conductor 120 disposed on a dielectric layer substrate 110. One end of the helical conductor 120 is connected to the solder pad 140 on the electronic device 130, and the other end of the helical conductor 120 is connected to the solder pad 160 on the circuit board 150. The deformation of the helical conductor 120 can absorb the horizontal or vertical stress deformation caused by CTE difference between the electronic device 130 and the circuit board 150.

Figure 2A:
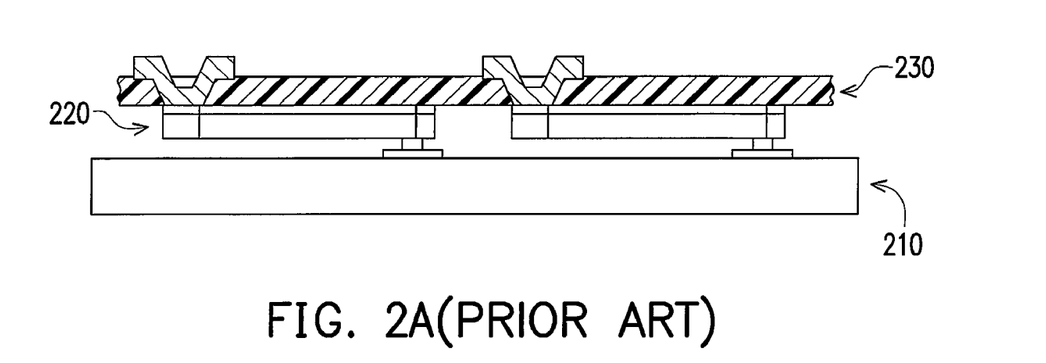
FIG. 2A is a cross-sectional view of another conventional contact structure.
Figure 2B:
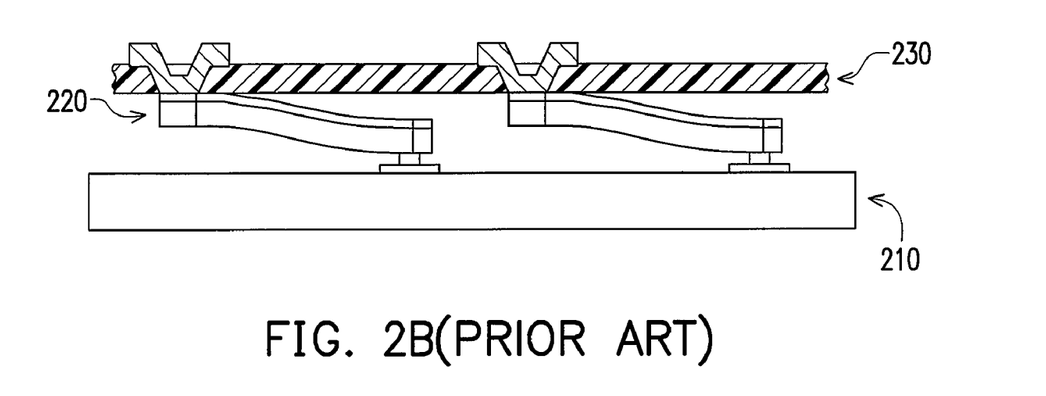
FIG. 2B is a cross-sectional view of the contact structure in FIG. 2A which is deformed.

Another contact structure for eliminating stress is disclosed in U.S. Pat. No. 5,763,941. FIG. 2A is a cross-sectional view of the contact structure. FIG. 2B is a cross-sectional view of the contact structure which is deformed by stress. Referring to FIGS. 2A~2B, the contact structure 200 includes a lead 220 disposed on a dielectric substrate 210, wherein the lead 220 can be separated into two parts, one end of the lead 220 is fixed on the dielectric substrate 210, and the other end of the lead 220 is connected to the electronic component 230. A compliant material can be further filled between the dielectric substrate 210 and the electronic component 230 for protecting the lead 220.

SUMMARY OF THE INVENTION

Accordingly, the present invention is directed to a contact structure on a substrate and a fabricating method thereof for improving the bonding between the substrate and components thereon.

The present invention is further directed to an electrical package and an interposer applicable to the electrical package, which can provide superior bonding effect between package components and can further improve the reliability of the electrical package.

As embodied and broadly described herein, the present invention provides a contact structure on a substrate, wherein the substrate has at least one contact. The contact structure includes a compliant layer, at least one solder pad, at least one conductive via, and at least one conductive arm. The compliant layer is disposed on the substrate and covers the contact. The solder pad is disposed on the surface of the compliant layer which is in opposite to the substrate. The conductive via is disposed in the compliant layer and is connected to the contact. The conductive arm is disposed on the surface of the compliant layer in opposite to the substrate, and two ends of the conductive arm are respectively connected to the conductive via and the solder pad.

The present invention further provides a fabricating method of a contact structure on a substrate. The substrate has at least one contact. The fabricating method includes following steps. First, a compliant layer covering the contact is formed on the substrate. Next, at least one through hole corresponding to the contact is formed in the compliant layer. After that, a conductive via is formed in the through hole, and at least one solder pad and at least one conductive arm are formed on the surface of the compliant layer which is in opposite to the substrate, wherein two ends of the conductive arm are respectively connected to the conductive via and the solder pad.

The present invention further provides an interposer for an electrical package, wherein the contact structure described above is adopted. The interposer includes a compliant layer, at least one first solder pad, at least one conductive via, and at least one first conductive arm. The first solder pad is disposed on a surface of the compliant layer, the conductive via is disposed in the compliant layer, the first conductive arm is disposed on a surface of the compliant layer, and two ends of the conductive arm are respectively connected to the conductive via and the first solder pad.

The present invention further provides an electrical package based on the interposer described above, wherein a first component and a second component are connected by the interposer. The first component has at least one first contact, and the second component has at least one second contact.

The interposer is disposed between the first component and the second component. The first contact is connected to the first solder pad and is coupled to the second contact via the conductive arm and the conductive via.

As described above, a contact structure composed of a compliant layer, a conductive arm, and a conductive via is adopted in the present invention so that the structure can absorb part of the stress received by the solder pad and the reliability of the product can be improved accordingly.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 5A~5C are cross-sectional views illustrating the fabrication flow of the contact structure in FIG. 4.

DESCRIPTION OF EMBODIMENTS

According to the present invention, a contact structure on a substrate and a fabricating method thereof, an interposer and an electrical package using the contact structure are provided. The aforementioned subject matters capable of providing superior bonding effect between package components are described in detail with the following embodiments. However, these embodiments are used for an exemplary description of the features of the present invention but not used to limit the scope and the application of the present invention.

First Embodiment

Figure 3:
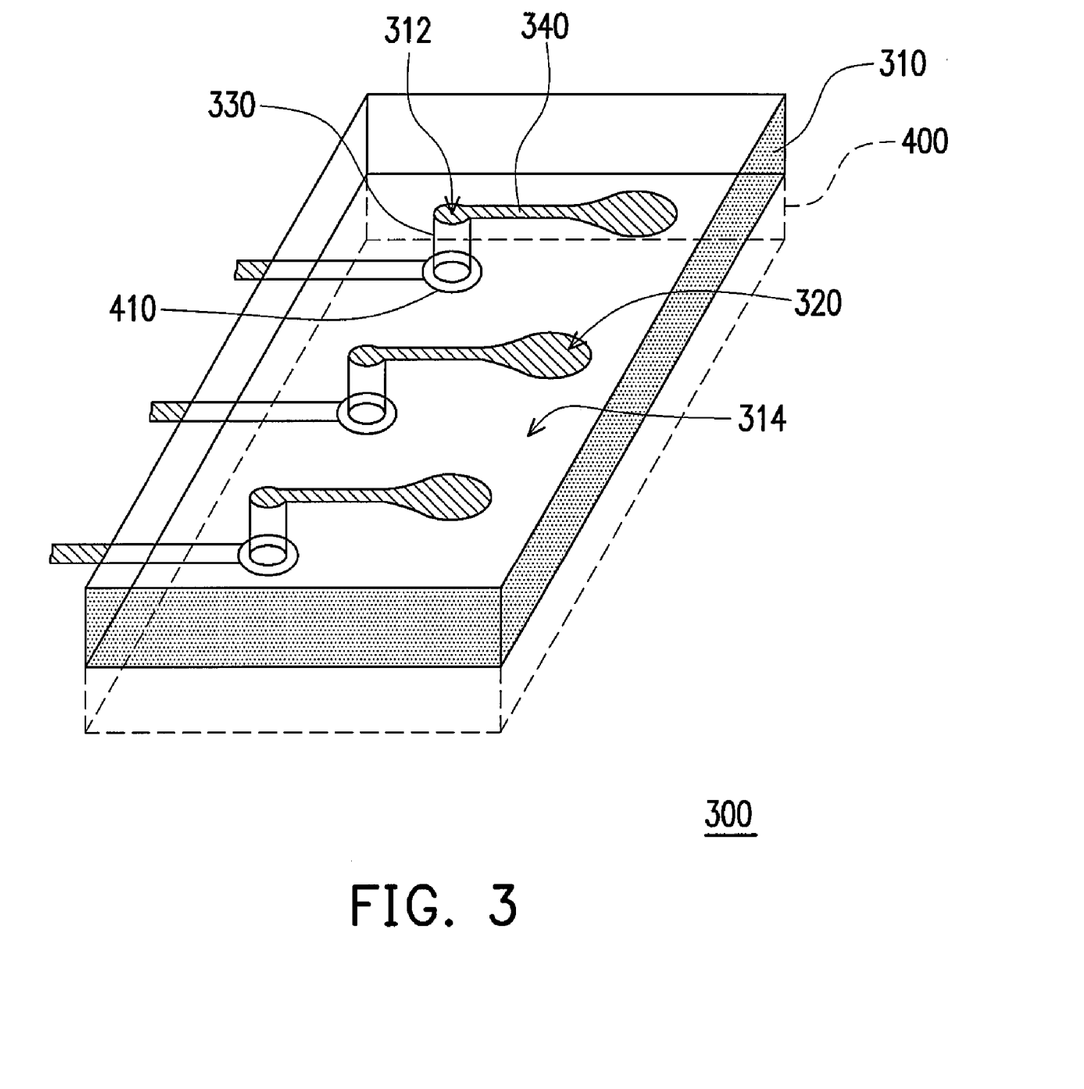
FIG. 3 is a perspective view of a contact structure on a substrate according to the first embodiment of the present invention.

FIG. 3 is a perspective view of a contact structure on a substrate according to the first embodiment of the present invention. Referring to FIG. 3, the contact structure 300 may be disposed on the substrate 400, and the substrate 400 has at least one contact 410. The contact structure 300 includes a compliant layer 310, at least one solder pad 320, at least one conductive via 330, and at least one conductive arm 340. The compliant layer 310 is disposed on the substrate 400 and covers the contact 410. The conductive via 330 is disposed in the compliant layer 310 and is connected to the contact 410, namely, the conductive via 330 is formed in the through hole 312 which connects two surfaces of the compliant layer 310 and is used for connecting the contact 410 and the conductive arm 340. The solder pad 320 is disposed on the surface 314 of the compliant layer 310 which is in opposite to the substrate 400, and the conductive arm 340 is also disposed on the surface 314 for connecting the conductive via 330 and the solder pad 320. The contact structure 300 may be applied to a printed circuit board (PCB) or a chip carrier for improving the reliability of the connection between the PCB or the chip carrier and components thereon.

In the present embodiment, preferably, the Young's modulus of the material of the compliant layer 310 is smaller than that of the substrate 400. Accordingly, the deformation of the compliant layer 310 is greater than that of the substrate 400 under the same stress. Thereby, when the contact structure 300 sustains a stress, the deformation of the compliant layer 310 can absorb most of the stress. In actual application, considering the typical materials of a substrate, the Young's modulus of the material of the compliant layer 310 may be between 1 MPa and 900 Pa. The material of the compliant layer 310 may be a modified polymer with low Young's modulus, such as silicone rubber, epoxy resin, polyimide, or Polytetrafluoroethyene. However, the material of the compliant layer 310 is not limited in the present invention.

In other embodiments of the present invention, a satisfying cushioning effect can be achieved without restricting the Young's modulus of the material of the compliant layer 310 if the structure composed of the solder pad 320, the conductive via 330, and the conductive arm 340 can provide enough flexible support.

Figure 4:
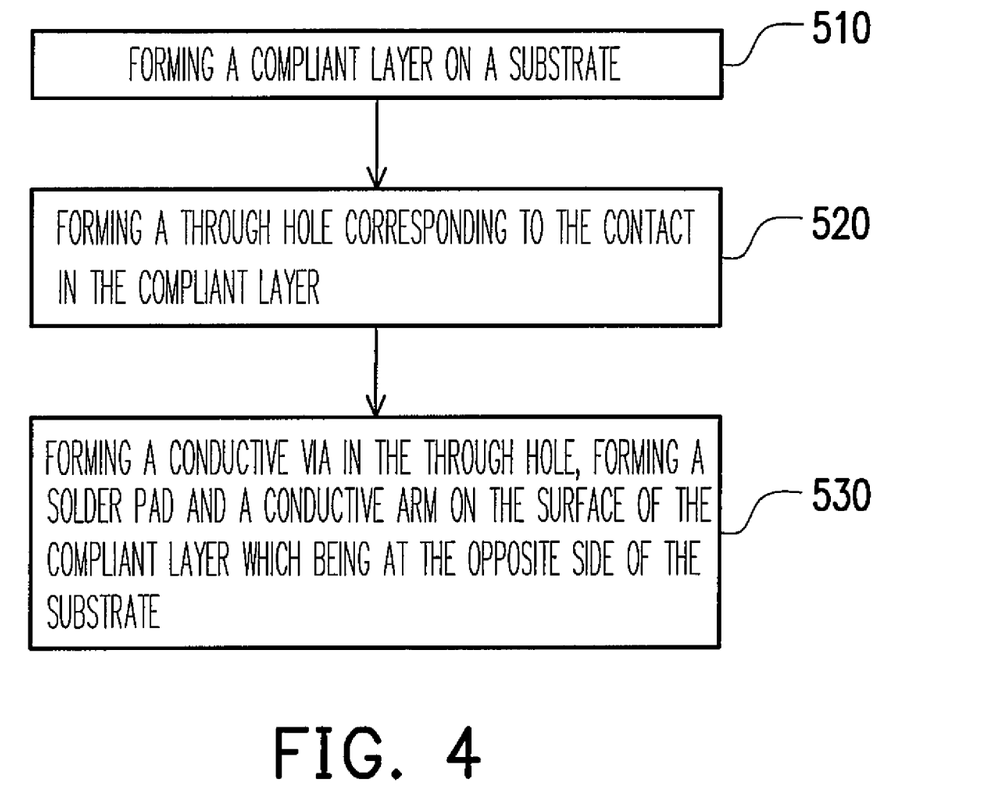
FIG. 4 is a flowchart illustrating a fabricating method of the contact structure in FIG. 1.
Figure 5A:
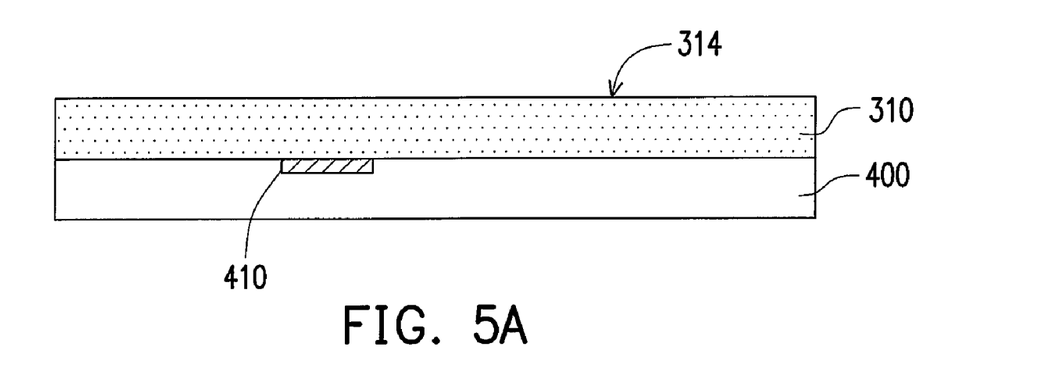
Figure 5B:
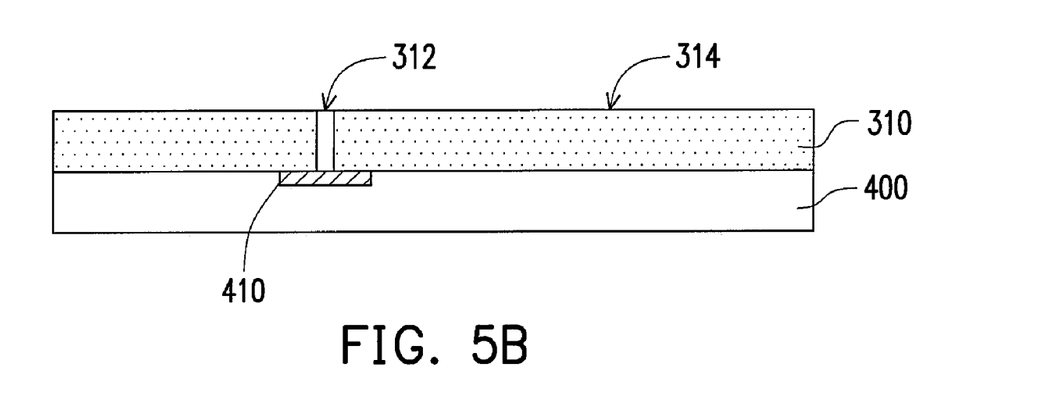

The fabricating method of the contact structure 300 is described in the following. FIG. 4 is a flowchart illustrating a fabricating method of the contact structure in FIG. 1. FIGS. 5A~5C are cross-sectional views illustrating the fabrication flow of the contact structure in FIG. 4. Referring to FIG. 4 and FIGS. 5A~5C, first, as shown in step 510 and FIG. 5A, the compliant layer 310 is formed on the substrate 400 and covers the contact 410 on the substrate 400. The formation method of the compliant layer 310 may be printing, coating, or injection.

Next, as shown in step 520 and FIG. 5B, a through hole 312 connecting two surfaces of the compliant layer 310 and corresponding to the contact 410 is formed in the compliant layer 310. The through hole 312 may be formed by performing laser drill or lithography to the compliant layer 310.

After that, as shown in step 530 and FIG. 5C, the conductive via 330 is formed in the through hole 312, and at least one solder pad 320 and at least one conductive arm 340 are formed on the surface 314 of the compliant layer 310 which is in opposite to the substrate 400, wherein two ends of the conductive arm 340 are respectively connected to the conductive via 330 and the solder pad 320. The conductive via 330, the solder pad 320, and the conductive arm 340 may be formed through plating or electroless plating, however, there is no set limit on the formation manner thereof in the present invention. It should be mentioned that the conductive via 330 in the present embodiment is a solid post fabricated by filling the through hole 312 with a conductive material. In other embodiments of the present invention, the conductive via 330 may also be fabricated by different method. For example, a conductive layer covering the inner wall of the through hole 312 and the surface of the contact 410 is formed for being as a hollow conductive via 330.

In the present embodiment, the contact structure 300 has the compliant layer 310 and further a structure composed of the conductive via 330 and the conductive arm 340 for cushioning most of the stress it receives, so as to protect the contact structure 300 and improve the reliability of the product accordingly.

Second Embodiment

Figure 6:
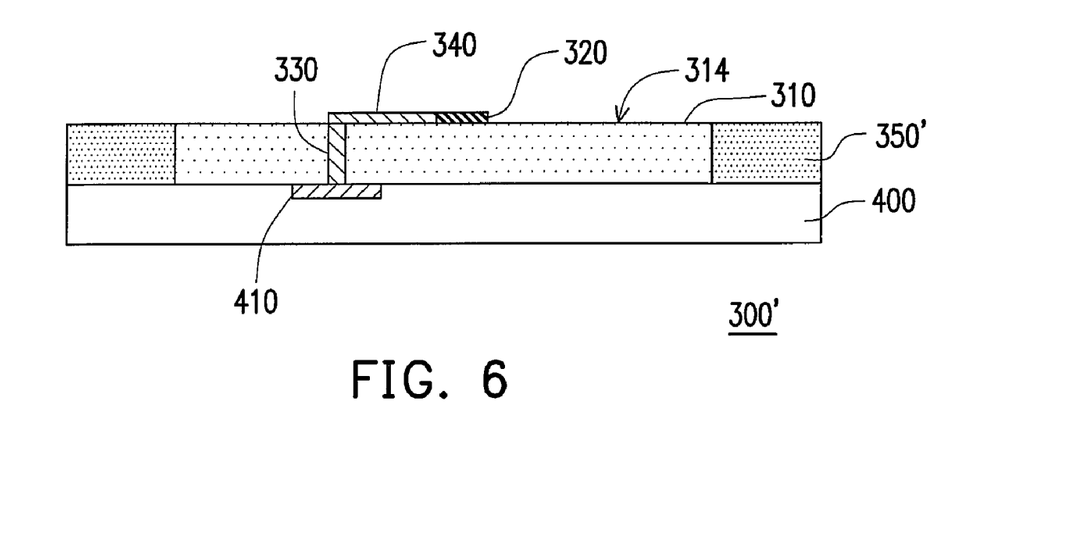
FIG. 6 is a cross-sectional view of a contact structure according to the second embodiment of the present invention.
Figure 7:
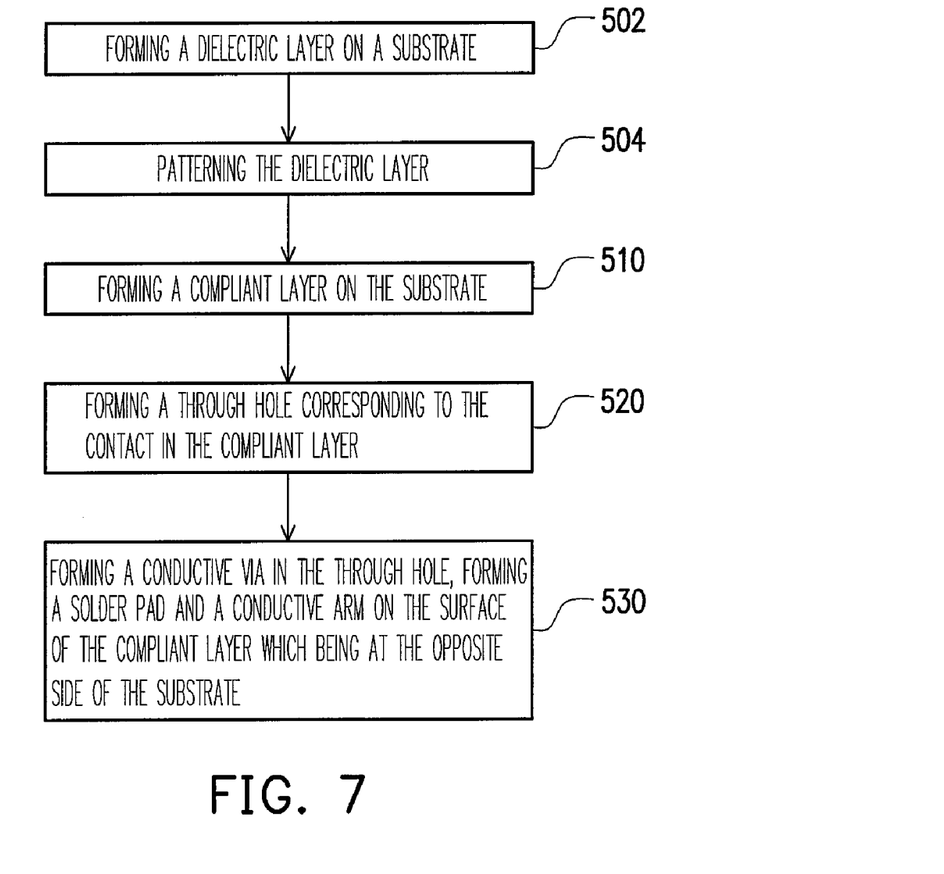
FIG. 7 is a flowchart illustrating a fabricating method of the contact structure in FIG. 6.
Figure 8A:
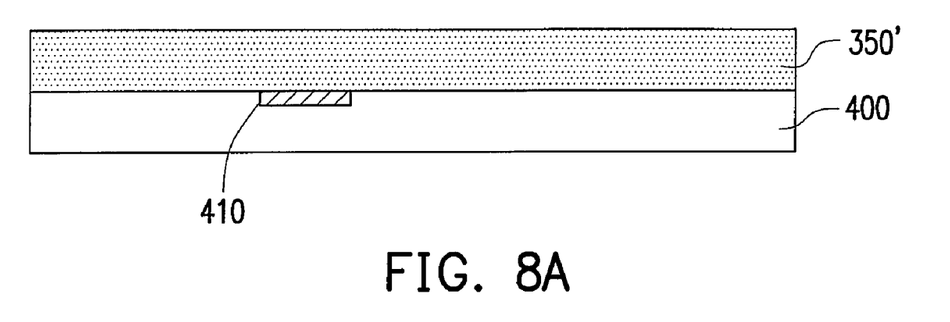
FIGS. 8A~8B are cross-sectional views illustrating the fabrication flow of the contact structure in FIG. 6.
Figure 8B:
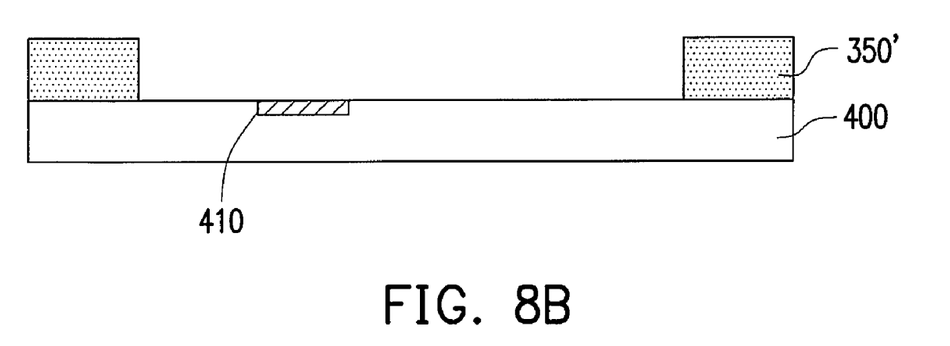

FIG. 6 is a cross-sectional view of a contact structure according to the second embodiment of the present invention. FIG. 7 is a flowchart illustrating a fabricating method of the contact structure in FIG. 6. FIGS. 8A~8B are cross-sectional views illustrating the fabrication flow of the contact structure in FIG. 6. In the present embodiment and the first embodiment, similar reference numerals or step numbers refer to similar elements or steps. Only the differences between the two embodiments will be described below.

Referring to FIG. 6, compared to the first embodiment, the contact structure 300' in the present embodiment further includes a dielectric layer 350' disposed on the substrate 400 and exposing a part of the surface of the substrate 400 including the contact 410. The compliant layer 310 covers the part of the surface of the substrate 400. The dielectric layer 350' may be used for dividing the substrate 400 into a plurality of regions, and the compliant layer 310 is formed in each region. The material of the dielectric layer 350' may be epoxy resin, polyimide, or any dielectric material applicable to built-up process. However, the material of the dielectric layer 350' is not limited in the present invention.

Referring to FIGS. 7, 8A, and 8B, the fabricating method of the contact structure 300' in the present embodiment is similar to that of the contact structure 300 in the first embodiment, while the difference is that steps 502 and 504 are further performed before step 510.

As described above, as shown in step 502 and FIG. 8A, the dielectric layer 350' is formed on the substrate 400 before the compliant layer 310 is formed. The dielectric layer 350' may be formed through lamination, printing, or coating. The dielectric layer 350' is then patterned in step 504 to expose a part of the surface of the substrate 400 including the contact 410, as shown in FIG. 8B. The patterning of the dielectric layer 350' may be performed through lithography, however, which is not limited in the present invention. Next, similar steps as those in the first embodiment are executed to fabricate the contact structure 300' illustrated in FIG. 7.

Third Embodiment

Figure 9:
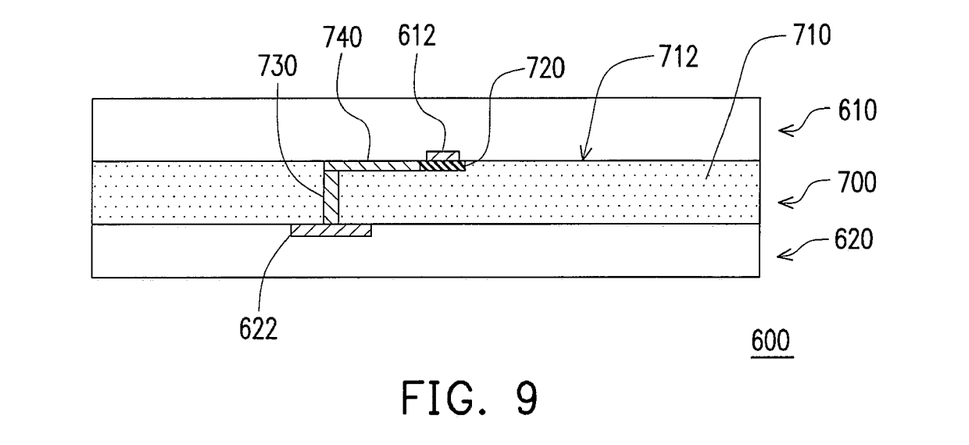
FIG. 9 is a cross-sectional view of an electrical package according to the third embodiment of the present invention.

FIG. 9 is a cross-sectional view of an electrical package according to the third embodiment of the present invention. Referring to FIG. 9, the electrical package 600 includes an interposer 700, a first component 610, and a second component 620. The first component 610 has at least one first contact 612, and the second component 620 has at least one second contact 622.

As described above, the interposer 700 includes a compliant layer 710, at least one solder pad 720, at least one conductive via 730, and at least one conductive arm 740. The conductive via 730 is disposed in the compliant layer 710 for connecting the second contact 622 and the conductive arm 740. The solder pad 720 is disposed on a surface 712 of the compliant layer 710. The conductive arm 740 is also disposed on the surface 712, and two ends of the conductive arm 740 are respectively connected to the conductive via 730 and the solder pad 720.

The interposer 700 is disposed between the first component 610 and the second component 620 for connecting the first component 610 and the second component 620. The first contact 612 on the first component 610 is connected to the solder pad 720 and is coupled to the second contact 622 via the conductive arm 740 and the conductive via 730. It should be mentioned here that the solder pad 720 and the first contact 612 may be bonded firm with conductive adhesive or solder.

It should be noted that the interposer 700 and components thereof are similar to the contact structure 300 in the first embodiment and can be fabricated with the same materials or the same method, which will not be repeated herein. However, other materials or methods may also be adopted by those having ordinary knowledge in the art to implement the electrical package according to foregoing description.

The first component 610 may be one of a chip, a chip carrier, and a PCB, and the second component 620 may be another one of the chip, the chip carrier, and the PCB. For example, the electrical package 600 may be applied to packages of a chip and a chip carrier, a chip and a PCB, or a chip carrier and a PCB for improving the reliability of the product. There is no set limit on the application of the electrical package in the present invention.

Fourth Embodiment

Figure 10:
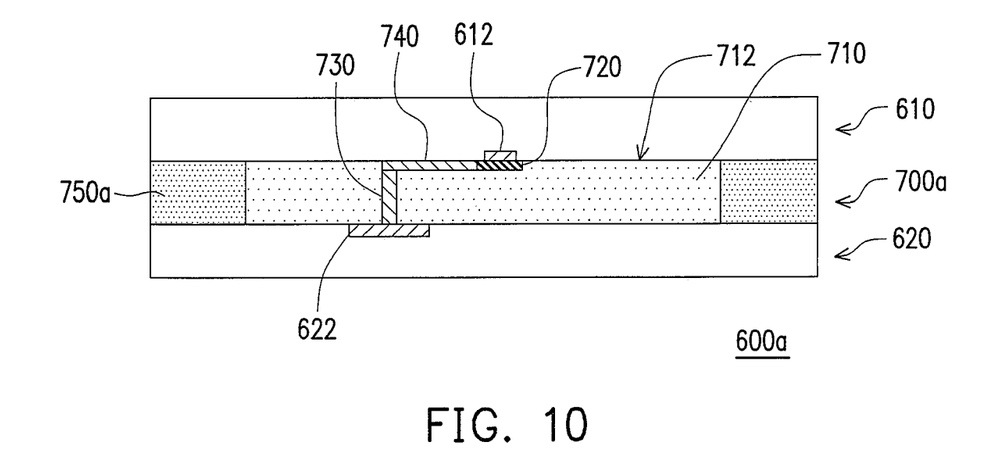
FIG. 10 is a cross-sectional view of an electrical package according to the fourth embodiment of the present invention.

FIG. 10 is a cross-sectional view of an electrical package according to the fourth embodiment of the present invention. In the present embodiment and the third embodiment, similar reference numerals refer to similar elements. Only the differences between the two embodiments will be described below.

Referring to FIG. 10, compared to the third embodiment, the interposer 700a of the electrical package 600a in the present embodiment further includes a dielectric layer 750a disposed on the second component 620 and exposing a part of the surface of the second component 620 including the second contact 622, and the compliant layer 710 covers the part of the surface of the second component 620. The dielectric layer 750a may be used for dividing the second component 620 into a plurality of regions, and the compliant layer 710 is formed in each region.

The material and fabricating method of the dielectric layer 750a are the same as those of the dielectric layer 350' in the second embodiment, which will not be repeated herein. However, other material or method may also be adopted by those having ordinary knowledge in the art for fabricating the dielectric layer 750a according to foregoing description.

Fifth Embodiment

Figure 11:
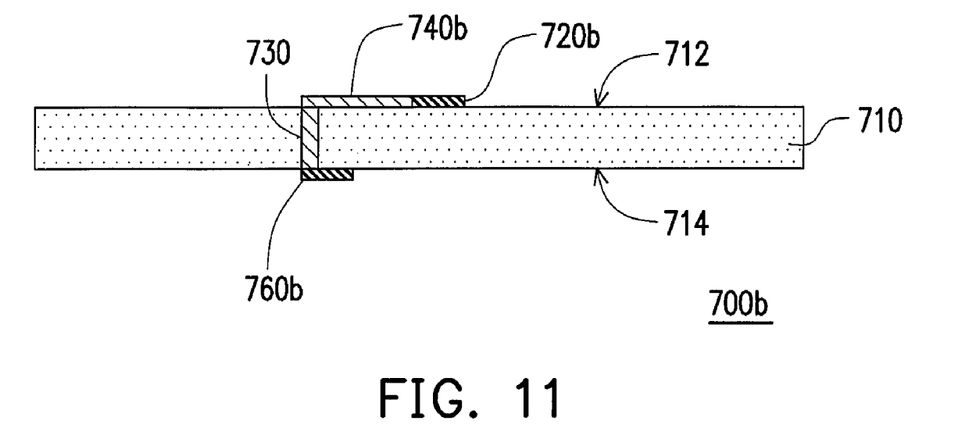
FIG. 11 illustrates an interposer according to the fifth embodiment of the present invention.

FIG. 11 illustrates an interposer according to the fifth embodiment of the present invention. The interposer may be applied to the electrical packages in the third and the fourth embodiments for connecting two different components.

Referring to FIG. 11, the interposer 700b includes a compliant layer 710, at least one first solder pad 720b, at least one conductive via 730, and at least one first conductive arm 740b. The first solder pad 720b is disposed on a surface 712 of the compliant layer 710. The first conductive arm 740b is disposed on the surface 712 of the compliant layer 710, and two ends of the first conductive arm 740b are respectively connected to the conductive via 730 and the first solder pad 720b. With the foregoing design, the contact of a component can be bonded to the first solder pad 720b and connected to the contact of another component via the first conductive arm 740*b* and the conductive via 730.

In addition, to allow the interposer 700*b* to be applicable to any type of device and any type of disposition, the interposer 700*b* further includes a second solder pad 760*b*. The second solder pad 760*b* is disposed on the other surface 714 of the compliant layer 710 which is in opposite to the first solder pad 720*b* and is connected to the conductive via 730.

Figure 12:
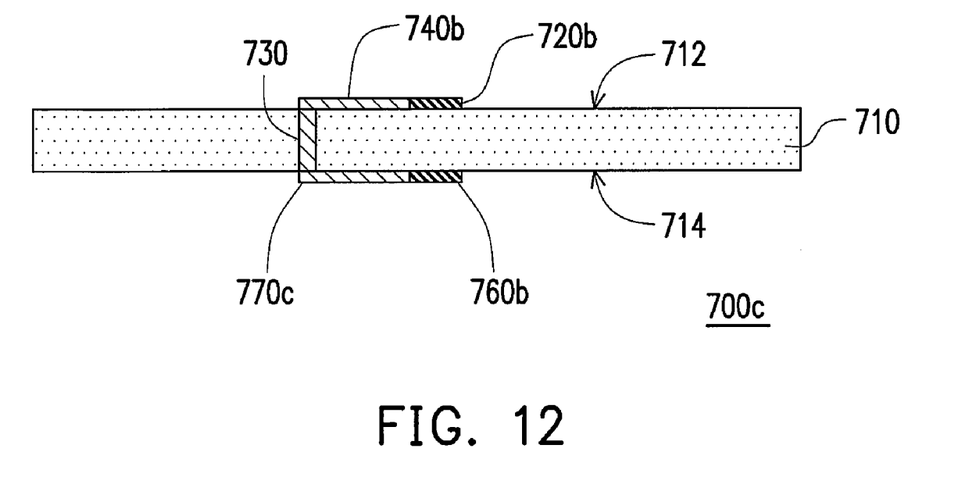
FIG. 12 illustrates an interposer according to another embodiment of the present invention.

Moreover, a conductive arm may be adopted for further improving the protection of the interposer 700*b* to the contact between the components. FIG. 12 illustrates another interposer according to another embodiment of the present invention. The interposer 700*c* is similar to the interposer 700*b*, and further includes a second conductive arm 770*c*. Two ends of the second conductive arm 770*c* are respectively connected to the conductive via 730 and the second solder pad 760*b*.

In summary, a contact structure composed of a compliant layer, a conductive arm, and a conductive via is adopted in the present invention for absorbing part of the stress received by the solder pad, so as to improve the bonding effect between the substrate and the components thereon. Besides, the contact structure in the present invention may help to eliminate the stress to a contact between a first component and a second component caused by difference in the coefficient of thermal expansion (CTE) of the two when the contact structure is applied to an electrical package, and further to improve the reliability of the product.

Moreover, the present invention may be applied to electrical packages of various levels, for example, the present invention may be applied between a chip and a chip carrier, between a chip carrier and a PCB, or between a chip and a PCB for improving the reliability of the electric package. Furthermore, the interposer in the present invention may be fabricated separately, and the arrangements of the solder pad and the conductive arm may be changed according to the requirements of design. Accordingly, if the interposer is applied to device packaging, the disposition of the device package and the interposer can be made more flexible.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A contact structure on a substrate, wherein the substrate has at least one contact, the contact structure comprising:
    a compliant layer, disposed on the substrate and covering the contact;
    a dielectric layer, disposed on the substrate and surrounding the compliant layer;
    at least one solder pad, disposed on a surface of the compliant layer which being in opposite to the substrate;
    at least one conductive via, disposed in the compliant layer and being connected to the contact; and
    at least one conductive arm, disposed on the surface of the compliant layer in opposite to the substrate, two ends of the conductive arm being respectively connected to the conductive via and the solder pad.

2. The contact structure as claimed in claim 1, wherein the dielectric layer exposes part of the surface of the substrate comprising the contact, and the compliant layer covers the part of the surface of the substrate.

3. The contact structure as claimed in claim 1, wherein the material of the dielectric layer comprises epoxy resin or polyimide.

4. The contact structure as claimed in claim 1, wherein the Young's modulus of the material of the compliant layer is smaller than the Young's modulus of the material of the substrate.

5. The contact structure as claimed in claim 4, wherein the Young's modulus of the material of the compliant layer is between 1 MPa and 900 MPa.

6. The contact structure as claimed in claim 1, wherein the material of the compliant layer comprises silicone rubber, epoxy resin, polyimide, or Polytetrafluoroethyene.

7. The contact structure as claimed in claim 1, wherein the substrate comprises a printed circuit board (PCB) or a chip carrier.

8. A fabricating method of a contact structure on a substrate, wherein the substrate has at least one contact, the fabricating method comprising:
    forming a compliant layer on the substrate for covering the contact;
    forming a dielectric layer on the substrate, the dielectric layer surrounding the compliant layer;
    forming at least one through hole corresponding to the contact in the compliant layer; and
    forming a conductive via in the through hole, and forming at least one solder pad and at least one conductive arm on a surface of the compliant layer in opposite to the substrate, wherein two ends of the conductive arm are respectively connected to the conductive via and the solder pad.

9. The fabricating method as claimed in claim 8, wherein the dielectric layer exposes part of the surface of the substrate comprising the contact.

10. The fabricating method as claimed in claim 8, wherein the dielectric layer is formed through lamination, printing, or coating.

11. The fabricating method as claimed in claim 8, wherein the compliant layer is formed through printing, coating, or injection.

12. The fabricating method as claimed in claim 8, wherein the through hole is formed by performing laser drill or lithography to the compliant layer.

13. The fabricating method as claimed in claim 8, wherein the method for forming the conductive via, the solder pad, and the conductive arm comprises plating or electroless plating.

14. The fabricating method as claimed in claim 8, wherein the substrate comprises a printed circuit board (PCB) or a chip carrier.

15. An electrical package, comprising:
    an interposer, comprising:
        a compliant layer;
        a dielectric layer, surrounding the compliant layer;
        at least one solder pad, disposed on a surface of the compliant layer;
        at least one conductive via, disposed in the compliant layer;
        at least one conductive arm, disposed on the surface of the compliant layer, two ends of the conductive arm being respectively connected to the conductive via and the solder pad;
    a first component, having at least one first contact;
    a second component, having at least one second contact,
    wherein the interposer and the dielectric layer are disposed between the first component and the second component, and the first contact is connected to the solder pad and is coupled to the second contact via the conductive arm and the conductive via.

16. The electrical package as claimed in claim 15, wherein the dielectric layer is disposed on the second component and exposes a part of the surface of the second component comprising the second contact, and the compliant layer covers the part of the surface of the second component.

17. The electrical package as claimed in claim 15, wherein the material of the dielectric layer comprises epoxy resin or polyimide.

18. The electrical package as claimed in claim 15, wherein the Young's modulus of the material of the compliant layer is smaller than the Young's modulus of the material of the substrate.

19. The electrical package as claimed in claim 18, wherein the Young's modulus of the material of the compliant layer is between 1 MPa and 900 MPa.

20. The electrical package as claimed in claim 15, wherein the material of the compliant layer comprises silicone rubber, epoxy resin, polyimide, or Polytetrafluoroethyene.

21. The electrical package as claimed in claim 15, wherein the first component comprises one of a chip, a chip carrier, and a PCB, and the second component comprises another one of the chip, the chip carrier, and the PCB.

22. An interposer for electrical package, the interposer comprising:
   a compliant layer;
   a dielectric layer, surrounding the compliant layer;
   at least one first solder pad, disposed on a surface of the compliant layer;
   at least one conductive via, disposed in the compliant layer; and
   at least one first conductive arm, disposed on the surface of the compliant layer, two ends of the first conductive arm being respectively connected to the conductive via and the first solder pad.

23. The interposer as claimed in claim 22 further comprising at least one second solder pad disposed on another surface of the compliant layer and connected to the conductive via.

24. The interposer as claimed in claim 22 further comprising:
   at least one second solder pad, disposed on the other surface of the compliant layer; and
   at least one second conductive arm, disposed on the surface of the compliant layer, two ends of the second conductive arm being respectively connected to the conductive via and the second solder pad.

25. The interposer as claimed in claim 22, wherein the Young's modulus of the material of the compliant layer is between 1 MPa and 900 MPa.

26. The interposer as claimed in claim 22, wherein the material of the compliant layer comprises silicone rubber, epoxy resin, polyimide, or Polytetrafluoroethyene.

* * * * *